US009316896B2

(12) United States Patent
Kadotani et al.

(10) Patent No.: US 9,316,896 B2
(45) Date of Patent: Apr. 19, 2016

(54) PROJECTOR WITH HOUSING INSERTS

(75) Inventors: Norikazu Kadotani, Matsumoto (JP); Kaname Nagatani, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 228 days.

(21) Appl. No.: 14/124,485

(22) PCT Filed: Jun. 13, 2012

(86) PCT No.: PCT/JP2012/003862
§ 371 (c)(1),
(2), (4) Date: Dec. 6, 2013

(87) PCT Pub. No.: WO2013/018266
PCT Pub. Date: Feb. 7, 2013

(65) Prior Publication Data
US 2014/0118708 A1    May 1, 2014

(30) Foreign Application Priority Data

Jun. 22, 2011 (JP) ................................ 2011-137999
Jun. 22, 2011 (JP) ................................ 2011-138237

(51) Int. Cl.
*G03B 21/20* (2006.01)
*H04N 9/31* (2006.01)
(Continued)

(52) U.S. Cl.
CPC .............. *G03B 21/20* (2013.01); *F21V 19/003* (2013.01); *F21V 19/045* (2013.01);
(Continued)

(58) Field of Classification Search
CPC .. G03B 21/20; G03B 21/2033; G03B 21/145; H04N 9/315; H05K 1/189; F21V 19/003; F21V 19/045; F21V 23/004
See application file for complete search history.

(56) References Cited

U.S. PATENT DOCUMENTS

| 5,912,773 A | 6/1999 | Barnett et al. |
| 2005/0001985 A1 | 1/2005 | Kitabayashi |

(Continued)

FOREIGN PATENT DOCUMENTS

| CN | 1578604 A | 2/2005 |
| CN | 1698009 A | 11/2005 |

(Continued)

OTHER PUBLICATIONS

Nov. 26, 2014 Extended European Search Report issued in Application No. 14175699.9.

(Continued)

*Primary Examiner* — Sultan Chowdhury
*Assistant Examiner* — Magda Cruz
(74) *Attorney, Agent, or Firm* — Oliff PLC

(57) ABSTRACT

A projector (1) includes a light source device (2), a light modulating device (5) that modulates a light beam emitted from the light source device (2), a projection optical device (7) that projects the light beam modulated by the light modulating device (5), a flexible printed circuit board (6), one end of which is connected to the light modulating device (5), and a housing (8) in which the light source device (2), the light modulating device (5), and the projection optical device (7) are housed. In a position in the housing (8) where the light modulating device (5) is disposed, a first insert-through section (8L1) for drawing around the flexible printed circuit (6) board to the outside (8L) of the housing (8) and a second insert-through section (8D1), through which a part of the light modulating device (5) is inserted, are formed.

11 Claims, 11 Drawing Sheets

(51) Int. Cl.
*H05K 1/18* (2006.01)
*F21V 19/00* (2006.01)
*F21V 19/04* (2006.01)
*F21V 23/00* (2015.01)
*G03B 21/00* (2006.01)
*G03B 21/14* (2006.01)
*G03B 21/16* (2006.01)

(52) U.S. Cl.
CPC .......... *F21V 23/004* (2013.01); *G03B 21/006* (2013.01); *G03B 21/145* (2013.01); *G03B 21/16* (2013.01); *G03B 21/2033* (2013.01); *G03B 21/2046* (2013.01); *H04N 9/315* (2013.01); *H04N 9/3173* (2013.01); *H05K 1/189* (2013.01)

(56) References Cited

U.S. PATENT DOCUMENTS

| | | |
|---|---|---|
| 2006/0077353 A1 | 4/2006 | Wu |
| 2006/0082695 A1* | 4/2006 | Miyashita ........... G02F 1/13452 349/58 |
| 2007/0195282 A1 | 8/2007 | Takasuka |
| 2008/0174741 A1 | 7/2008 | Yanagisawa et al. |
| 2008/0187303 A1 | 8/2008 | Ito |
| 2009/0033880 A1 | 2/2009 | Heo et al. |
| 2010/0091501 A1* | 4/2010 | Tan et al. ................ 362/294 |
| 2010/0103304 A1 | 4/2010 | Ito |

FOREIGN PATENT DOCUMENTS

| | | | |
|---|---|---|---|
| JP | U-3074653 | 1/2001 | |
| JP | 2004-170512 A | 6/2004 | |
| JP | A-2005-31250 | 2/2005 | |
| JP | 2006139022 A | 6/2006 | |
| JP | 2006171268 A | 6/2006 | |
| JP | A-2007-333773 | 12/2007 | |
| JP | 2008090163 A | 4/2008 | |
| JP | 2009251424 A * | 10/2009 | ............ G03B 21/00 |
| JP | 2010066424 A | 3/2010 | |
| JP | A-2010-276979 | 12/2010 | |

OTHER PUBLICATIONS

International Search Report issued in Application No. PCT/JP2012/003862; Dated Nov. 28, 2012.

* cited by examiner

PROJECTOR WITH HOUSING INSERTS

BACKGROUND

1. Technical Field

The present invention relates to a projector.

2. Related Art

In the past, there is known a projector including a light source device, a light modulating device that modulates a light beam emitted from the light source device, and a projection optical device that projects the light beam modulated by the light modulating device (see, for example, JP-A-2007-333773).

In the projector described in PTL1, in order to reduce the size of the projector, as the light source device, an LED (Light Emitting Diode) light source is adopted rather than a light source lamp of an discharge type.

This LED light source includes a configuration in which a light emitting device (a light emitting section) is mounted on an LED circuit board.

The light modulating device (a liquid crystal device) is electrically connected to, via a flexible printed circuit board, a control board that controls the operations of the light modulating device and the LED light source. A signal is output from the control board via the flexible printed circuit board, whereby the light modulating device is controlled.

Similarly, a connector provided on the LED board and the control board are connected by the flexible printed circuit board and a signal is output from the control board via the flexible printed circuit board, whereby the LED light source is controlled.

Optical components such as the light source device, the light modulating device, and the projection optical device are usually housed in a container-like housing.

As such a housing, in order to draw around the flexible printed circuit board connected to the light modulating device to the outside of the housing, in general, a cutout is formed on the sidewall of the housing.

The sidewall of the housing needs to have a height dimension substantially the same as the width dimension of the flexible printed circuit board (substantially the same as the height dimension of the light modulating device) in order to cover a connecting portion of the light modulating device and the flexible printed circuit board.

Among the optical components (the light source device, the light modulating device, the projection optical device, etc.) housed in the housing, the light modulating device has a size limited according to the number of pixels, a pixel pitch, and the like. On the other hand, since the other optical components are lenses and the like, the sizes of the other optical components can be set smaller than the size of the light modulating device (the sectional shapes of the other optical components orthogonal to an optical axis can be set smaller than the sectional shape of the light modulating device).

Therefore, a dimension obtained by adding the height dimension of the light modulating device or the height dimension of the sidewall of the housing to the thickness dimension of the bottom portion of the housing is practically the thickness dimension of the projector. There is a problem in that it is difficult to reduce the thickness of the projector to about a dimension substantially the same as the height dimension of the light modulating device.

In particular, when the projector is configured as a Pico-projector (also referred to as micro-projector or nano-projector in some case) used together with an electronic device (e.g., incorporated in the electronic device) such as a digital camera, a cellular phone, or a notebook PC (Personal Computer), it is difficult to design the projector to a desired thickness dimension.

SUMMARY

An advantage of some aspects of the invention is to provide a projector that can be reduced in thickness.

An aspect of the invention is directed to a projector including a light source device, a light modulating device that modulates a light beam emitted from the light source device, and a projection optical device that projects the light beam modulated by the light modulating device. The projector includes a flexible printed circuit board, one end of which is connected to the light modulating device, and a housing in which the light source device, the light modulating device, and the projection optical device are housed. In a position in the housing where the light modulating device is disposed, a first insert-through section for drawing around the flexible printed circuit board to the outside of the housing and a second insert-through section, through which a part of the light modulating device is inserted, are formed.

In the aspect of the invention, in the position in the housing where the light modulating device is disposed, the first and second insert-through sections are formed.

Therefore, for example, by forming the second insert-through section in the bottom portion of the container-like housing and inserting a part of the light modulating device through the second insert-through section, it is possible to locate the light modulating device in a position offset to the bottom portion side of the housing with respect to the other optical components.

By forming the first insert-through section in the sidewall of the housing, it is possible to draw around the flexible printed circuit board to the outside of the housing from the side of the housing via the first insert-through section.

Further, as described above, since the light modulating device is located in the offset position, even if the height dimension of the sidewall of the housing is set small compared with the configuration in the past, it is possible to sufficiently cover a connecting portion of the light modulating device and the flexible printed circuit board.

Consequently, a dimension obtained by adding the height dimension of the sidewall of the housing to the thickness dimension of the bottom portion of the housing is not the thickness dimension of the projector. Therefore, it is possible to reduce the thickness of the projector to reduce the thickness dimension of the projector to about a dimension substantially the same as the height dimension of the light modulating device.

In the projector of the aspect of the invention, it is preferred that the housing includes a first housing section and a second housing section formed separate from each other and combined with each other. The light modulating device is disposed in a connecting position of the first housing section and the second housing section. The first insert-through section and the second insert-through section are formed by combining the first housing section and the second housing section.

According to this configuration, the first and second insert-through sections are formed by combining the first and second housing sections.

Consequently, for example, compared with the housing including one member, it is possible to easily form the first and second insert-through sections.

If an illuminating system such as the light source device is housed in the first housing section and the projection optical device is housed in the second housing section, in a state in which the light source device and the like are housed in the housing, it is possible to easily carry out adjustment (optical axis adjustment) of a positional relation between the illuminating system such as the light source device and the projection optical device.

In the projector of the aspect of the invention, it is preferred that the projector includes a connecting member that integrates the first housing section and the second housing section.

According to this configuration, since the projector includes the connecting member, even if the housing includes the first and second housing sections formed separate from each other, it is possible to integrate the first and second housing sections using the connecting member and increase the strength of the housing.

In the projector of the aspect of the invention, it is preferred that the housing is formed to have a substantially rectangular parallelepiped shape by combining the first housing section and the second housing section. The connecting member includes a connecting member body attached to a first side surface of the housing to extend over the connecting position and a reinforcing section that projects from the connecting member body and is disposed to be opposed to a second side surface different from the first side surface in the housing to extend over the connecting position.

According to this configuration, since the connecting member includes the connecting member body and the reinforcing section, it is possible to effectively increase the strength of the housing by reinforcing the housing with the connecting member body and the reinforcing section from the sides of the different two surfaces (the first and second side surfaces) of the housing to extend over the connecting position where strength is low.

In the projector of the aspect of the invention, it is preferred that the first insert-through section is formed on the second side surface.

According to this configuration, the first insert-through section is formed on the second side surface. In other words, when the flexible printed circuit board is drawn around to the outside of the housing via the first insert-through section, the flexible printed circuit board is drawn around to the side where the reinforcing section is disposed.

Consequently, it is possible to close the first insert-through section and prevent a deficiency from occurring in the connecting portion of the light modulating device and the flexible printed circuit board while reinforcing the housing with the reinforcing section.

In the projector of the aspect of the invention, it is preferred that the housing is formed to have a substantially rectangular parallelepiped shape by combining the first housing section and the second housing section. The connecting member includes a connecting member body attached to a first side surface of the housing to extend over the connecting position. A first opening for inserting the light modulating device into the inside of the housing is formed on the first side surface. A part of the light modulating device projects from the first opening in a state in which the light modulating device is housed in the housing. A second opening through which the part of the light modulating device projecting from the first opening is inserted is formed in the connecting member body.

According to this configuration, for example, the housing is configured such that a part of the light modulating device projects from a container-like opening portion (the first opening). The connecting member body forming the connecting member is attached to the housing to close the opening portion of the housing. In this case, the second opening is formed in the connecting member body. Therefore, when the connecting member body is attached to the housing, since a part of the light modulating device is inserted through the second opening, the connecting member body does not mechanically interfere with the light modulating device.

Therefore, it is possible to impart, to the connecting member, a function of a lid for closing the opening portion of the housing besides a function of increasing the strength of the housing. Since the second opening is formed in the connecting member body, the thickness dimension of the connecting member body is not added to the thickness dimension of the projector. It is possible to set the thickness dimension of the projector to about a dimension substantially the same as the height dimension of the light modulating device.

In the projector of the aspect of the invention, it is preferred that the connecting member is formed of a thermally conductive material and includes a light source connecting section connected to the light source device to be capable of transmitting heat.

According to this configuration, since the connecting member includes the light source connecting section, it is possible to radiate heat generated by lighting driving for the light source device to the outside through a heat transmission path from the light source device to the connecting member (the light source connecting section). Therefore, it is possible to effectively suppress heat deterioration of the light source device.

In the projector of the aspect of the invention, it is preferred that the projector includes a connecting member formed of a thermally conductive material and attached to the outer surface of the housing. An opening for light source is formed in the housing to correspond to a disposed position of the light source device. The connecting member includes a light source connecting section connected to the light source device via the opening for light source to be capable of transmitting heat and a first sidewall section and a second sidewall section respectively projecting from end edges opposed to each other in the light source connecting section. The housing is disposed in a space surrounded by the light source connecting section, the first sidewall section, and the second sidewall section.

The LED light source generates heat during driving. Specifically, there is a problem in that it is likely that, according to the heat generation, the temperature on the inside of the housing rises and the temperature of the other optical components (e.g., the light modulating device) also rises to cause heat deterioration of the light source device and the other optical components.

In particular, when the projector is configured as a pico-projector, since the optical components are disposed in close contact with one another on the inside of the housing, the problem is conspicuous.

According to the configuration described above, the connecting member attached to the outer surface of the housing includes the light source connecting section connected to the light source device via the opening for light source, which is formed in the housing, to be capable of transmitting heat.

Consequently, it is possible to effectively radiate heat generated in the light source device during driving to the outside of the housing via the light source connecting section, i.e., effectively cool the light source device.

Therefore, it is possible to prevent a temperature rise on the inside of the housing due to the heat generation during the driving of the light source device and prevent heat deterioration of not only the light source device but also the other optical components such as the light modulating device.

The connecting member includes the first and second sidewall sections disposed in positions opposed to each other and connected to the light source connecting section.

Consequently, for example, when the projector of the aspect of the invention is configured as a pico-projector and incorporated in an electronic device such as a digital camera, it is possible to set one of the first and second sidewall sections in contact with the inner surface of an outer housing in the electronic device. Specifically, since the first and second sidewall sections are disposed in the positions opposed to each other, even if it is necessary to oppositely set the positional relation between the first and second sidewall sections because of design, it is possible to set one of the first and second sidewall sections in contact with the inner surface of the outer housing in the electronic device.

As explained above, one of the first and second sidewall sections is set in contact with the inner surface of the outer housing in the electronic device. Therefore, it is possible to form a heat transmission path for the outer housing from the light source device to the light source connecting section, one of the first and second sidewall sections, and the electronic device. It is possible to effectively radiate the heat of the light source device to the outside of the outer housing in the electronic device through the heat transmission path. Specifically, it is possible to prevent a temperature rise on the inside of the outer housing in the electronic device and prevent heat deterioration of not only the optical components of the projector but also the members included in the electronic device.

The housing is disposed in the space surrounded by the light source connecting section and the first and second sidewall sections. Therefore, it is possible to impart a function of reinforcing the housing to the connecting member besides the heat radiating function.

In the projector of the aspect of the invention, it is preferred that a first opening through which a part of the light modulating device is inserted is formed in the housing. A second opening cut out to avoid the part of the light modulating device inserted through the first opening is formed in the first sidewall section.

According to this configuration, since the second opening is formed in the first sidewall section, the part of the light modulating device inserted through the first opening and the first sidewall section do not mechanically interfere with each other.

Therefore, it is possible to prevent heat transmitted to the first sidewall section from being transmitted to the light modulating device through a heat transmission path from the light source device to the light source connecting section and the first sidewall section and effectively prevent heat deterioration of the light modulating device.

In the projector of the aspect of the invention, it is preferred that the connecting member includes a third sidewall section connected to the light source connecting section, the first sidewall section, and the second sidewall section. The housing is disposed in a space surrounded by the light source connecting section, the first sidewall section, the second sidewall section, and the third sidewall section.

According to this configuration, the connecting member includes the third sidewall section besides the light source connecting section and the first and second sidewalls sections.

Consequently, for example, when the projector of the aspect of the invention is configured as a Pico-projector and incorporated in an electronic device such as a digital camera, effects explained below are obtained.

If the pico-projector is disposed at a corner portion on the inside of an outer housing in the electronic device, it is possible to set not only one of the first and second sidewall sections but also the third sidewall, section in contact with the inner surface of the outer housing in the electronic device.

Therefore, it is possible to increase a heat quantity transmitted from the connecting member to the outer housing in the electronic device, effectively radiate the heat of the light source device to the outside of the outer housing in the electronic device, and effectively prevent a temperature rise on the inside of the outer housing in the electronic device.

Since the third sidewall section is provided in the connecting member and the housing is disposed in the space surrounded by the light source connecting section and the first to third sidewall sections, it is possible to effectively reinforce the housing.

In the projector of the aspect of the invention, it is preferred that the flexible printed circuit board is drawn around such that the other end separates from the third sidewall section via the first insert-through section.

According to this configuration, the flexible printed circuit board is drawn around via the first insert-through section for drawing around the flexible printed circuit board to the outside of the housing as explained above such that the other end separates from the third sidewall section. In other words, the third sidewall section is provided on the opposite side of the disposed side of a control board to which the flexible printed circuit board (the other end) is connected.

Consequently, for example, when the projector of the aspect of the invention is configured as a pico-projector and incorporated in an electronic device such as a digital camera, if the pico-projector is disposed at a corner portion on the inside of an outer housing in the electronic device, it is possible to set the third sidewall section in contact with the inner surface of the outer housing in the electronic device without being limited by the control board (without being obstructed by the control board).

DESCRIPTION OF EXEMPLARY EMBODIMENTS

First Embodiment

A first embodiment of the invention is explained below with reference to the drawings.

Configuration of a Projector

Figure 1:
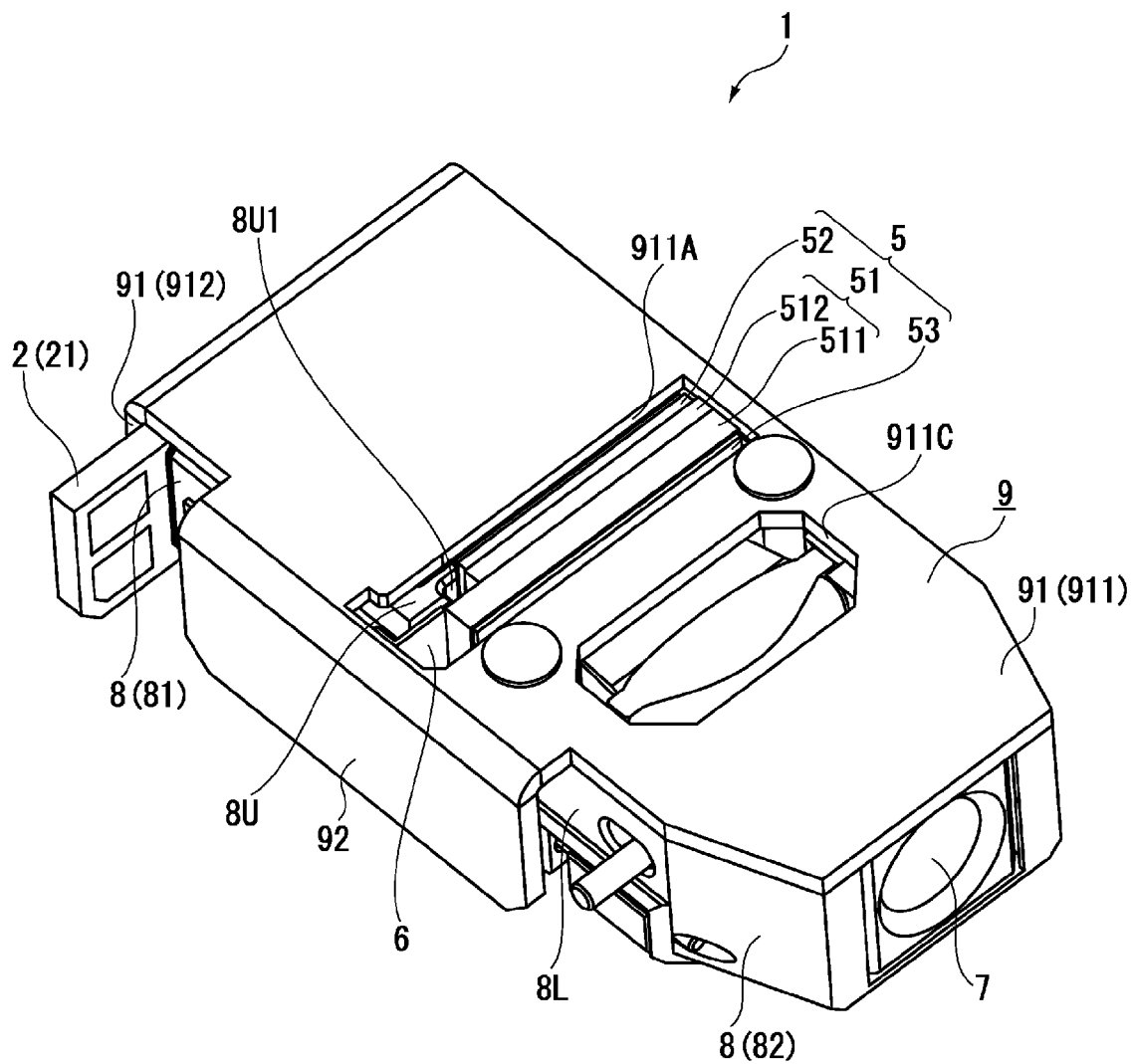
FIG. 1 is a diagram showing the configuration of a projector in a first embodiment.
Figure 2:
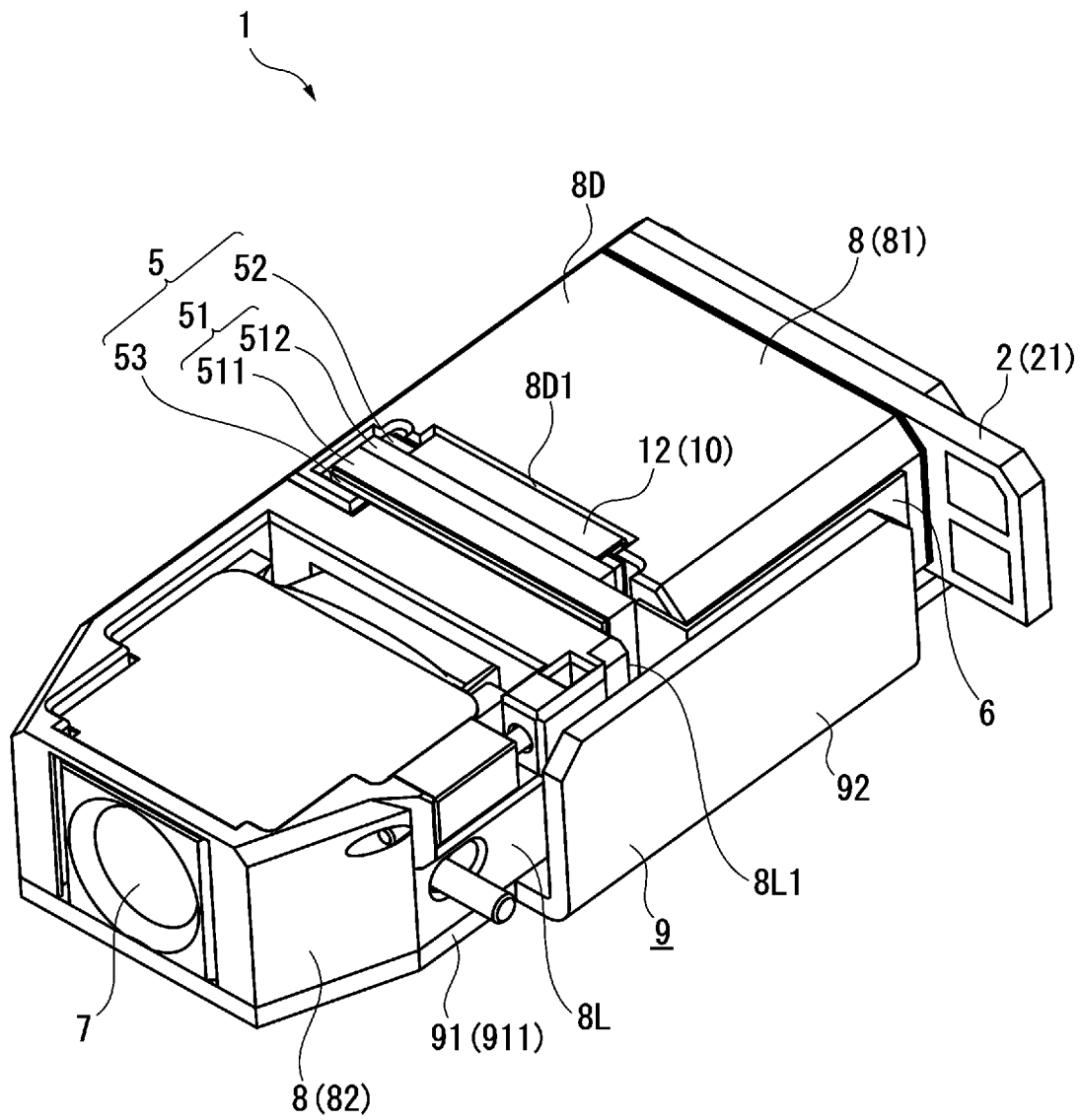
FIG. 2 is a diagram showing the configuration of the projector in the first embodiment.
Figure 3:
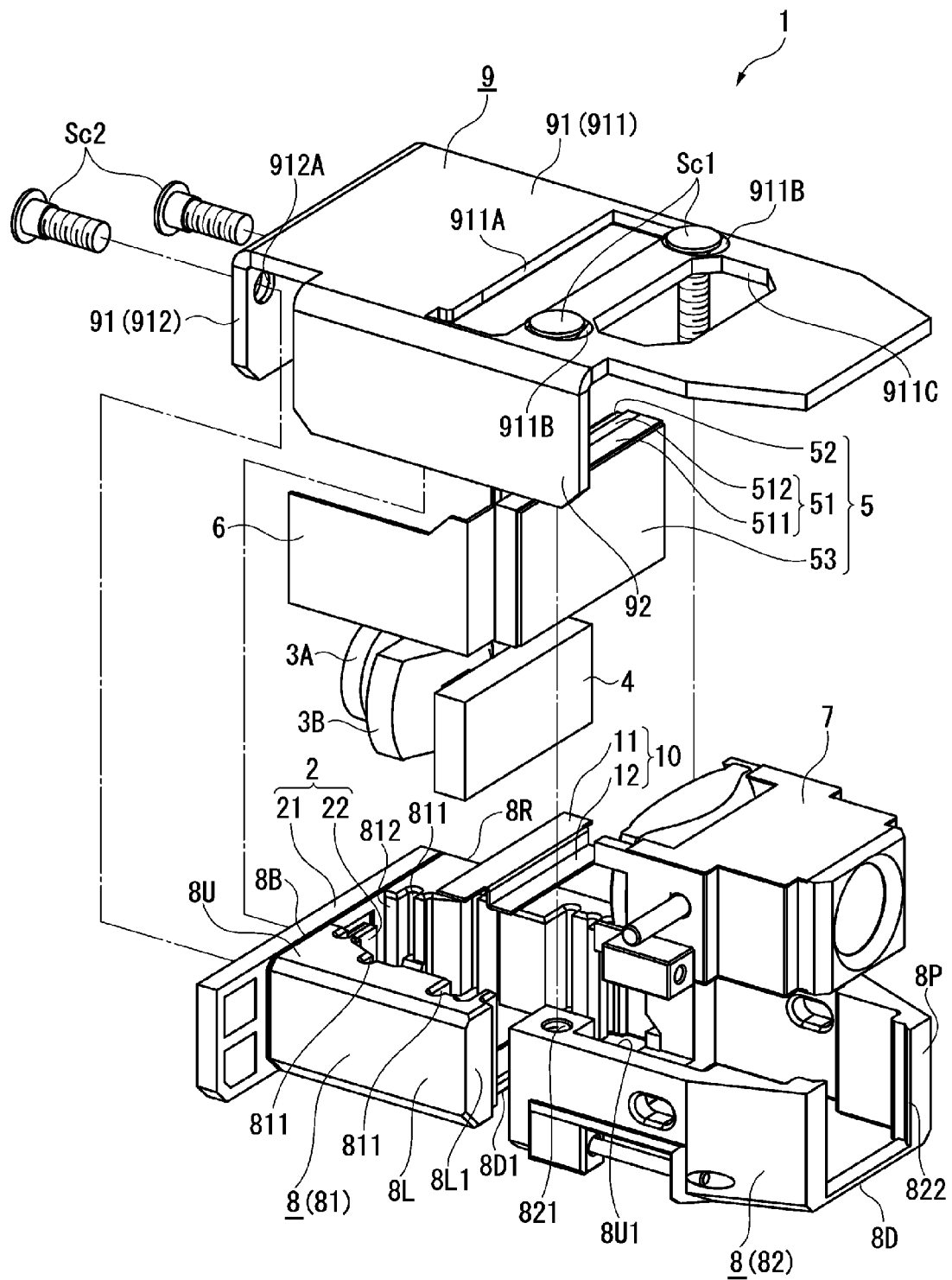
FIG. 3 is a diagram showing the configuration of the projector in the first embodiment.
Figure 4:
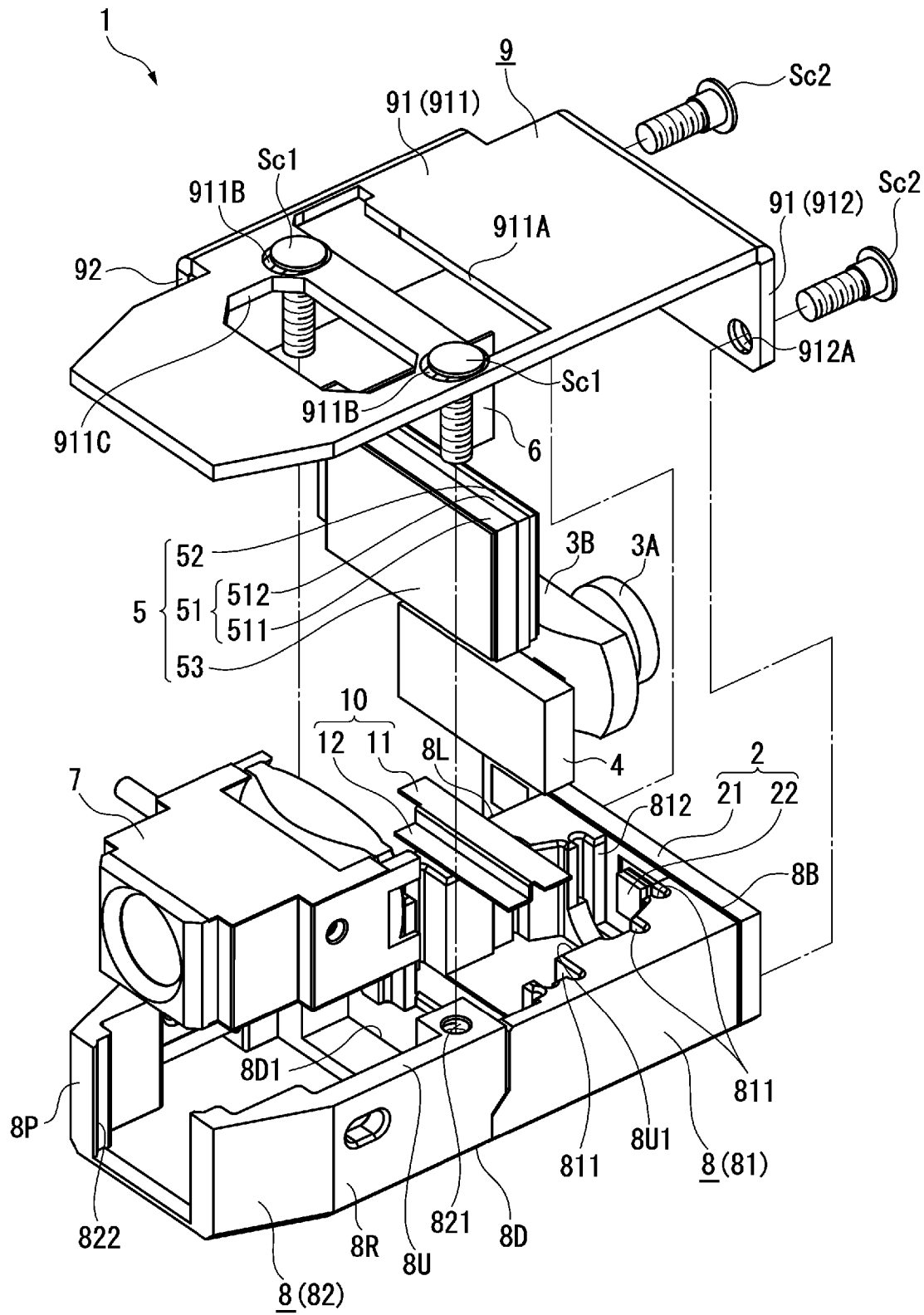
FIG. 4 is a diagram showing the configuration of the projector in the first embodiment.

FIGS. 1 to 4 are diagrams showing the configuration of a projector 1 in the first embodiment. Specifically, FIG. 1 is a perspective view of the projector 1 viewed from the top surface side (the upper side). FIG. 2 is a perspective view of the projector 1 viewed from the bottom surface side (the lower side). FIGS. 3 and 4 are disassembled perspective views of the projector 1 viewed from the upper side.

The projector 1 projects an image and displays the projected image on a screen (not shown in the figures).

The projector 1 in this embodiment is configured as a small optical module (a pico-projector) mounted on an electronic device (not shown in the figures) such as a digital camera, a cellular phone, or a notebook PC.

As shown in FIGS. 1 to 4, the projector 1 includes a light source device 2, first and second lenses 3A and 3B (FIGS. 3 and 4), a polarizing beam splitter 4 (FIGS. 3 and 4), a liquid crystal panel 5 functioning as a light modulating device, a flexible printed circuit board (hereinafter, FPC) 6, a projection lens 7 functioning as a projection optical device, a housing 8, and a connecting member 9.

With the configuration explained above, a light beam emitted from the light source device 2 is, after being converted into substantially parallel beams by the first and second lenses 3A and 3B, converted into linearly polarized light of practically one kind by the polarizing beam splitter 4. The light beam (the linearly polarized light) converted by the polarizing beam splitter 4 is, after being modulated by the liquid crystal panel 5, projected on a screen (not shown in the figures) by the projection lens 7.

Configuration of the Light Source Device

The light source device 2 is subjected to lighting control under the control by a control board (not shown in the figures) provided on the inside of the electronic device.

As shown in FIGS. 3 and 4, the light source device 2 includes a printed circuit board 21 and an LED 22 functioning as a light emitting device.

In this embodiment, the printed circuit board 21 includes a metal core PCB (Printed Circuit Board) processed using metal such as aluminum or copper as a base.

As shown in FIG. 3 or 4, the printed circuit board 21 is formed in a rectangular plate shape and is formed to have a height dimension (the length dimension in the up down direction in FIGS. 3 and 4) same as the height dimension of a sixth side surface 8B explained below of the housing 8 and have a lateral dimension (the length dimension in the left right direction in FIGS. 3 and 4) longer than the lateral dimension of the sixth side surface 8B.

Although not shown in FIGS. 3 and 4, a connector to which a flexible printed circuit board (a flexible printed circuit board for electrically connecting the control board and the printed circuit board 21) is connected is provided in the printed circuit board 21.

In the printed circuit board 21, a positioning structure for positioning the LED 22 in an emission position for emitting a light beam to the liquid crystal panel 5 (hereinafter, a positioning structure for the LED 22) is provided. However, the positioning structure is explained below.

The LED 22 is mounted on the printed circuit board 21.

Electric power for lighting is supplied from the control board to the light source device 2 via the flexible printed circuit board (not shown in the figures) connected to the connector (not shown in the figures) and a signal is input to the light source device 2 from the control board, whereby the light source device 2 is subjected to lighting control.

Configuration of the Liquid Crystal Panel

The liquid crystal panel 5 modulates an incident light beam under the control by the control board.

In this embodiment, as shown in FIG. 3 or 4, the liquid crystal panel 5 includes a panel body 51, an incident side polarizer 52, and an emission side polarizer 53.

As shown in FIG. 3 or 4, the panel body 51 includes a configuration in which liquid crystal, which is an electro-optical substance, is hermetically sealed in a pair of substrates 511 and 512 having a rectangular shape in plan view made of glass or the like.

The substrate 511 of the pair of substrates 511 and 512 is a driving substrate for driving the liquid crystal. The substrate 511 includes plural data lines formed to be arrayed in parallel to one another, plural scanning lines formed to be arrayed in a direction orthogonal to the plural data lines, pixel electrodes formed to be arrayed in a matrix shape to correspond to crossing of the scanning lines and the data lines, a switching device such as a TFT (Thin Film Transistor), and a driving circuit that drives the switching device.

The substrate 512 is an opposed substrate arranged to be opposed to the substrate 511 at a predetermined space therefrom on a light incident side of the substrate 511. The substrate 512 includes a common electrode to which a predetermined voltage Vcom is applied.

A signal is input to the substrate 512 from the control board via the FPC 6 (a signal line for driving of the liquid crystal panel 5), whereby a voltage is applied between a predetermined one of the pixel electrodes and the common electrode, an oriented state of the liquid crystal interposed between the pixel electrode and the common electrode is controlled, and an incident light beam is modulated.

The incident side polarizer 52 is attached to a light incident surface of the panel body 51. The incident side polarizer 52 transmits only predetermined linearly polarized light (linearly polarized light converted by the polarizing beam splitter 4).

The emission side polarizer 53 is attached to a light emission surface of the panel body 51. The emission side polarizer 53 transmits only linearly polarized light having a polarization direction orthogonal to a polarization direction of the linearly polarized light converted by the polarizing beam splitter 4.

Configuration of the FPC

The FPC 6 is formed by, for example, patterning a signal wire (the signal line for driving of the liquid crystal panel 5, etc.) on a base material of polyimide or the like. The FPC 6 electrically connects the control board and the liquid crystal panel 5.

Specifically, one end side of the FPC 6 is electrically connected to, by compression bonding or the like, an external circuit connection terminal (not shown in the figures) formed near an end of the liquid crystal panel 5.

A connector (not shown in the figures) is provided on the other end side of the FPC 6. The FPC 6 is electrically connected to the control board via the connector.

Configuration of the Housing

In the housing 8, the light source device 2, the first and second lenses 3A and 3B, the polarizing beam splitter 4, the liquid crystal panel 5, and the projection lens 7 are housed.

In this embodiment, as shown in FIG. 3 or 4, the housing 8 is configured to linearly dispose the light source device 2, the first and second lenses 3A and 3B, the polarizing beam splitter 4, the liquid crystal panel 5, and the projection lens 7.

As shown in FIG. 3 or 4, the housing 8 includes a first housing section 81 and a second housing section 82 formed separate from each other. The housing 8 is formed to have a substantially rectangular parallelepiped shape by combining the first and second housing sections 81 and 82 with each other.

In the following explanation, for convenience of explanation, on the outer surfaces of the housing 8, a surface on the upper side is referred to as first side surface 8U, a surface on the left side viewed from a projection side in FIGS. 3 and 4 is referred to as second side surface 8L, a surface on the lower side is referred to as third side surface 8D, a surface on the right side viewed from the projection side in FIGS. 3 and 4 is referred to as fourth side surface 8R, a surface on the projection side is referred to as fifth side surface 8P, and a surface opposed to the fifth side surface 8P is referred to as sixth side surface 8B.

As shown in FIG. 3 or 4, the housing 8 is formed in a container shape having a first opening 8U1 on the first side surface 8U.

The first housing section 81 is a section in which the light source device 2, the first and second lenses 3A and 3B, and the polarizing beam splitter 4 are housed.

In the first housing section 81, on the inner surface, as shown in FIG. 3 or 4, plural grooves 811 are formed. The plural grooves 811 are used for sliding the first and second lenses 3A and 3B and the polarizing beam splitter 4 from the first side surface 8U side to and disposing the first and second lenses 3A and 3B and the polarizing beam splitter 4 on the inside of the first housing section 81.

In the first housing section 81, on the sixth side surface 8B, as shown in FIG. 3 or 4, an opening for light source 812 is formed. The opening for light source 812 communicates with the inside and the outside of the first housing section 81, communicates with the first opening 8U1 as well, and is used for disposing the LED 22 on the inside of the first housing section 81.

On the sixth side surface 8B in the first housing section 81, as in the printed circuit board 21, the positioning structure for the LED 22 is provided. However, the positioning structure is explained below.

The second housing section 82 is a section in which the projection lens 7 is housed.

In the second housing section 82, on the first side surface 8U, as shown in FIG. 3 or 4, a pair of first screw holes 821 are formed in order to connect the second housing section 82 and the connecting member 9. In the pair of first holes 821, a pair of first fixing screws Sc1 are respectively screwed.

In the second housing section 82, on the fifth side surface 8P, as shown in FIG. 3 or 4, an opening for passage 822 is formed. The opening for passage 822 communicates with the inside and the outside of the second housing section 82, communicates with the first opening 8U1 as well, and is used for allowing a light beam projected by the projection lens 7 to pass.

In the housing 8 explained above, in a state in which the first and second housing sections 81 and 82 are combined, the liquid crystal panel 5 is disposed between the first and second housing sections 81 and 82 (a connecting position of the first and second housing sections 81 and 82) via a sheet metal member 10 (FIGS. 3 and 4) explained below.

On the second side surface 8L, in the connecting position of the first and second housing sections 81 and 82, as shown in FIG. 2 or 3, a first insert-through section 8L1 for drawing around the FPC 6 to the outside of the housing 8 is formed.

Similarly, on the third side surface 8D, in the connecting position of the first and second housing sections 81 and 82, as shown in FIGS. 2 to 4, a second insert-through section 8D1 through which a part of the liquid crystal panel 5 is inserted is formed.

Specifically, in the state in which the first and second housing sections 81 and 82 are combined with each other, the first and second housing sections 81 and 82 are set such that ends thereof on the second side surface 8L side separate a predetermined space from each other. The separating portions function as the first insert-through section 8L1 explained above. The same applies to the second insert-through section 8D1.

As shown in FIG. 3 or 4, the sheet metal member 10 is a member formed such that a first plate section 11 and a second plate section 12 having a tabular shape are parallel to each other while having a step therebetween.

The first plate section 11 is held between the polarizing beam splitter 4 and the bottom of the first housing section 81 in a state in which the polarizing beam splitter 4 is housed in the first housing section 81.

As shown in FIG. 2, the second plate section 12 is drawn out to the outside of the housing 8 via the second insert-through section 8D1. The liquid crystal panel 5 is placed and fixed on the second plate section 12.

As shown in FIG. 1, a part of the liquid crystal panel 5 projects from the first opening 8U1 in a state in which the liquid crystal panel 5 is housed in the housing 8 via the sheet metal member 10. As shown in FIG. 2, a part of the liquid crystal panel 5 inserted through the second insert-through section 8D1 is substantially flush with the third side surface 8D.

Configuration of the Connecting Member

The connecting member 9 is a member that is connected to the first and second housing sections 81 and 82 and integrates the first and second housing sections 81 and 82. As shown in FIG. 3 or 4, the connecting member 9 includes a connecting member body 91 and a reinforcing section 92.

As shown in FIG. 3 or 4, the connecting member body 91 includes a tabular lid section 911 having a planar shape substantially the same as the shape of the first side surface 8U of the housing 8 and a tabular light source connecting section 912 having a planar shape substantially the same as the shape of the sixth side surface 8B of the housing 8.

The lid section 911 functions as a lid body that comes into contact with the first side surface 8U and closes the first opening 8U1 in a state in which the connecting member 9 is connected to the housing 8.

In the lid section 911, in a position corresponding to a disposed position of the liquid crystal panel 5, as shown in FIG. 1, 3, or 4, a second opening 911A having a substantially rectangular shape is formed. Through the second opening 911A, the part of the liquid crystal panel 5 projecting from the first opening 8U1 is inserted in a state in which the connecting member 9 is connected to the housing 8.

In the lid section 911, in positions corresponding to the pair of first screw holes 821 of the housing 8, as shown in FIG. 3 or 4, a pair of fixing holes 9113 are formed in order to connect the second housing section 82 and the connecting member 9. Through the pair of fixing holes 9113, the pair of first fixing screws Sc1 are respectively inserted.

Further, in the lid section 911, in a position corresponding to a disposed position of the projection lens 7, as shown in FIG. 1, 3, or 4, a substantially rectangular opening for lens 911C is formed. The opening for lens 911C is used for exposing a part of the projection lens 7 to the outside in a state in which the connecting member 9 is connected to the housing 8.

The light source connecting section 912 substantially vertically hangs down from the end edge on the sixth side surface 8B side in the lid section 911 and holds the printed circuit board 21 between the light source connecting section 912 and the sixth side surface 8B in a state in which the connecting member 9 is connected to the housing 8.

In the light source connecting section 912, as in the printed circuit board 21 and the first housing section 81, the positioning structure for the LED 22 is provided. However, the positioning structure is explained below.

The reinforcing section 92 includes a rectangular plate member substantially vertically hanging down from the end edge on the second side surface 8L side in the lid section 911. As shown in FIG. 1 or 2, the reinforcing section 92 is disposed to be opposed to the second side surface 8L at a predetermined space therefrom to extend over a connecting position of the first and second housing sections 81 and 82 in a state in which the connecting member 9 is connected to the housing 8.

The connecting member 9 explained above is formed of a thermally conductive material such as copper.

Positioning Structure for the LED

Figure 5:
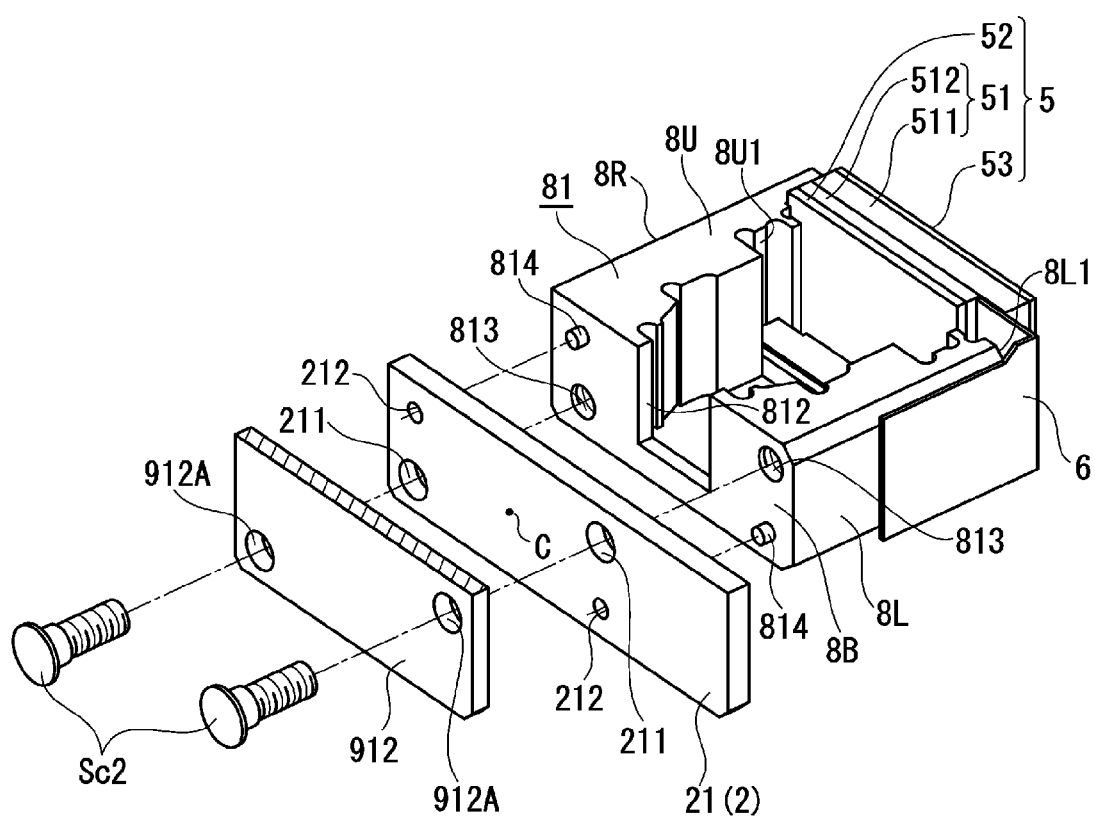
FIG. 5 is a diagram for explaining a positioning structure for an LED in the first embodiment.

FIG. 5 is a diagram for explaining the positioning structure for the LED 22. Specifically, FIG. 5 is a disassembled perspective view of the first housing section 81, the light source device 2, and the light source connecting section 912 viewed from the sixth side surface 8B side.

First, a positioning structure provided in the printed circuit board 21 is explained.

In the printed circuit board 21, in positions opposed to each other centering around a mounting position C where the LED 22 is mounted, as shown in FIG. 5, a pair of first fixing holes 211 are formed. The pair of first fixing holes 211 pierce through the printed circuit board 21 from the front to the rear. Through the pair of first fixing holes 211, a pair of second fixing screws Sc2 are respectively inserted.

In a position avoiding the pair of first fixing holes 211, a pair of positioning holes 212 are formed to be opposed to each other centering around the mounting position C.

A positioning structure provided in the first housing section 81 is explained.

On the sixth side surface 8B of the first housing section 81, in positions corresponding to the pair of first fixing holes 211, as shown in FIG. 5, a pair of second screw holes 813 are formed in order to connect the first housing section 81 and the connecting member 9. In the pair of second screw holes 813, the pair of second fixing screws Sc2 are respectively screwed.

On the sixth side surface 8B, in positions corresponding to the pair of positioning holes 212, a pair of positioning protrusions 814 are formed. The pair of positioning protrusions 814 respectively fit in the pair of positioning holes 212.

A positioning structure provided in the light source connecting section 912 is explained.

In the light source connecting section 912, in positions corresponding to the pair of first fixing holes 211, as shown in FIG. 5, a pair of second fixing holes 912A are formed in order to connect the connecting member 9 and the first housing section 81. Through the pair of second fixing holes 912A, the pair of second fixing screws Sc2 are respectively inserted.

The pair of positioning protrusions 814 are respectively fit in the pair of positioning holes 212, whereby the LED 22 is positioned in an emitting position where the LED 22 emits a light beam to the liquid crystal panel 5.

The first and second fixing holes Sc1 and Sc2 are respectively screwed in the first and second screw holes 821 and 813 via the holes 911B, 912A, and 211, whereby the first and second housing sections 81 and 82 are integrated by the connecting member 9 and the printed circuit board 21 is held between the sixth side surface 8B and the light source connecting section 912.

In this state, the light source connecting section 912 is connected to the light source device 2 (to the LED 22 via the printed circuit board 21) to be capable of transmitting heat. As shown in FIG. 1, the part of the liquid crystal panel 5 projecting from the first opening 8U1 is substantially flush with the upper surface of the lid section 911.

According to the first embodiment explained above, effects explained below are obtained.

In this embodiment, in the housing 8, the first and second insert-through sections 8L1 and 8D1 are formed in the position where the liquid crystal panel 5 is disposed.

Consequently, since a part of the liquid crystal panel 5 is inserted through the second insert-through section 8D1, it is possible to position the liquid crystal panel 5 in a position offset to the third side surface 8D (the bottom portion of the housing 8) side with respect to the other optical components 2, 3A, 3B, 4, and 7.

Since the first insert-through section 8L1 is formed on the second side surface 8L of the housing 8, it is possible to draw around the FPC 6 from the side of the housing 8 to the outside of the housing 8 via the first insert-through section 8L1.

Further, since the liquid crystal panel 5 is positioned in the position offset to the third side surface 8D side as explained above, even if the height dimension of the sidewalls (the second and fourth side surfaces 8L and 8R) of the housing is set small compared with the configuration in the past, it is possible to sufficiently cover the connecting portion of the liquid crystal panel 5 and the FPC 6.

Consequently, a dimension obtained by adding the thickness dimension of the bottom portion of the housing 8 to the height dimension of the sidewalls (the second and fourth side surfaces 8L and 8R) is not the thickness dimension (the height dimension in the up down direction in FIGS. 1 and 2) of the projector 1. Therefore, it is possible to reduce the thickness of the projector 1 to reduce the thickness dimension of the projector 1 to about a dimension substantially the same as the height dimension of the liquid crystal panel 5.

The first and second insert-through sections 8L1 and 8D1 are formed by combining the first and second housing sections 81 and 82.

Consequently, for example, compared with the housing 8 including one member, it is possible to easily form the first and second insert-through sections 8L1 and 8D1.

Since the first and second insert-through sections 8L1 and 8D1 communicate with each other, it is possible to easily carry out incorporation of the liquid crystal panel 5 in the housing 8.

Further, since the illuminating systems 2, 3A, 3B, and 4 are housed in the first housing section 81 and the projection lens 7 is housed in the second housing section 82, it is possible to easily carry out adjustment (optical axis adjustment) of a positional relation between the illuminating systems 2, 3A, 3B, and 4 and the projection lens 7 in a state in which these optical components are housed in the housing 8.

Since the projector 1 includes the connecting member 9, even if the housing 8 includes the first and second housing sections 81 and 82 formed separate from each other, it is possible to integrate the first and second housing sections 81 and 82 using the connecting member 9 and increase the strength of the housing 8.

Further, since the connecting member 9 includes the connecting member body 91 and the reinforcing section 92, it is possible to effectively increase the strength of the housing 8 by reinforcing the housing 8 with the connecting member body 91 and the reinforcing section 92 from the sides of the different two surfaces (the first and second side surfaces 8U and 8L) of the housing 8 to extend over the connecting position of the first and second housing sections 81 and 82 where strength is low.

The first insert-through section 8L1 is formed on the second side surface 8L. In other words, when the FPC 6 is drawn around to the outside of the housing 8 via the first insert-through section 8L1, the FPC 6 is drawn around to the side where the reinforcing section 92 is disposed.

Consequently, it is possible to close the first insert-through section 8L1 and prevent a deficiency from occurring in the connecting portion of the liquid crystal panel 5 and the FPC 6 while reinforcing the housing 8 with the reinforcing section 92.

Further, the housing 8 is configured such that a part of the liquid crystal panel 5 projects from the first opening 8U1, which is a container-like opening portion. The connecting member body 91 is attached to the first side surface 8U to close the first opening 8U1 of the housing 8. In this case, the second opening 911A is formed in the connecting member body 91. Therefore, when the connecting member body 91 is attached to the housing 8, since a part of the liquid crystal panel 5 is inserted through the second opening 911A, the connecting member body 91 does not mechanically interfere with the liquid crystal panel 5.

Therefore, it is possible to impart, to the connecting member 9, a function of a lid for closing the opening portion of the housing 8 besides a function of increasing the strength of the housing 8. Since the second opening 911A is formed in the lid section 911, the thickness dimension of the lid section 911 is not added to the thickness dimension of the projector 1. It is possible to set the thickness dimension of the projector 1 to about a dimension substantially the same as the height dimension of the liquid crystal panel 5.

Since the connecting member 9 includes the light source connecting section 912, it is possible to radiate heat generated by lighting driving for the LED 22 to the outside through a heat transmission path from the LED 22 to the printed circuit board 21 and the connecting member (the light source connecting section 912). Therefore, it is possible to effectively suppress heat deterioration of the light source device 2.

Further, since the second opening 911A is formed in the connecting member 9, it is possible to suppress heat transmitted from the light source device 2 to the connecting member 9 from being transmitted to the liquid crystal panel 5.

Second Embodiment

A second embodiment of the invention is explained with reference to the drawings.

In the following explanation, components and members same as those in the first embodiment are denoted by the same reference numerals and signs and detailed explanation of the components and the members is omitted or simplified.

Figure 6:
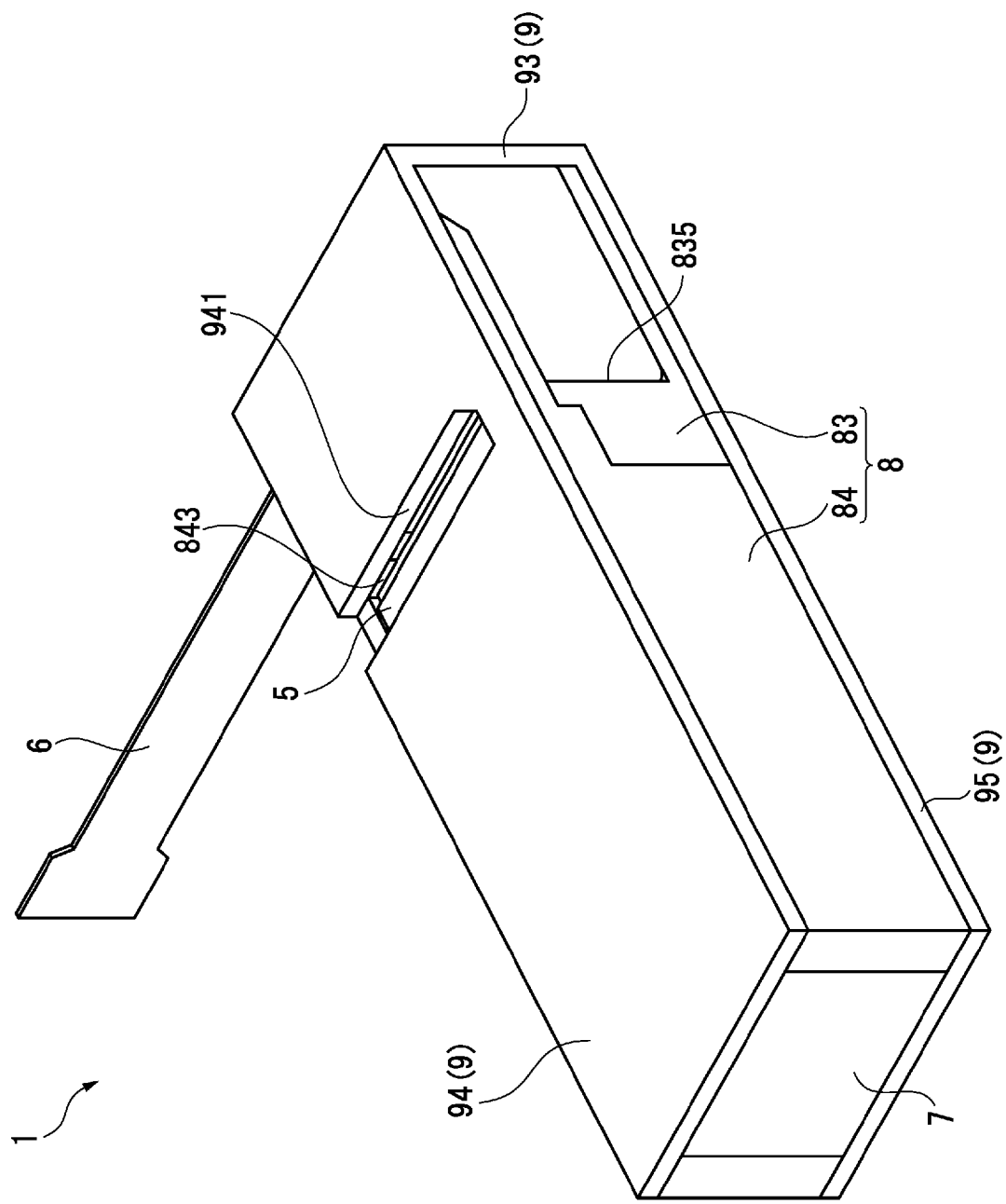
FIG. 6 is a diagram showing the configuration of a projector in a second embodiment.
Figure 7:
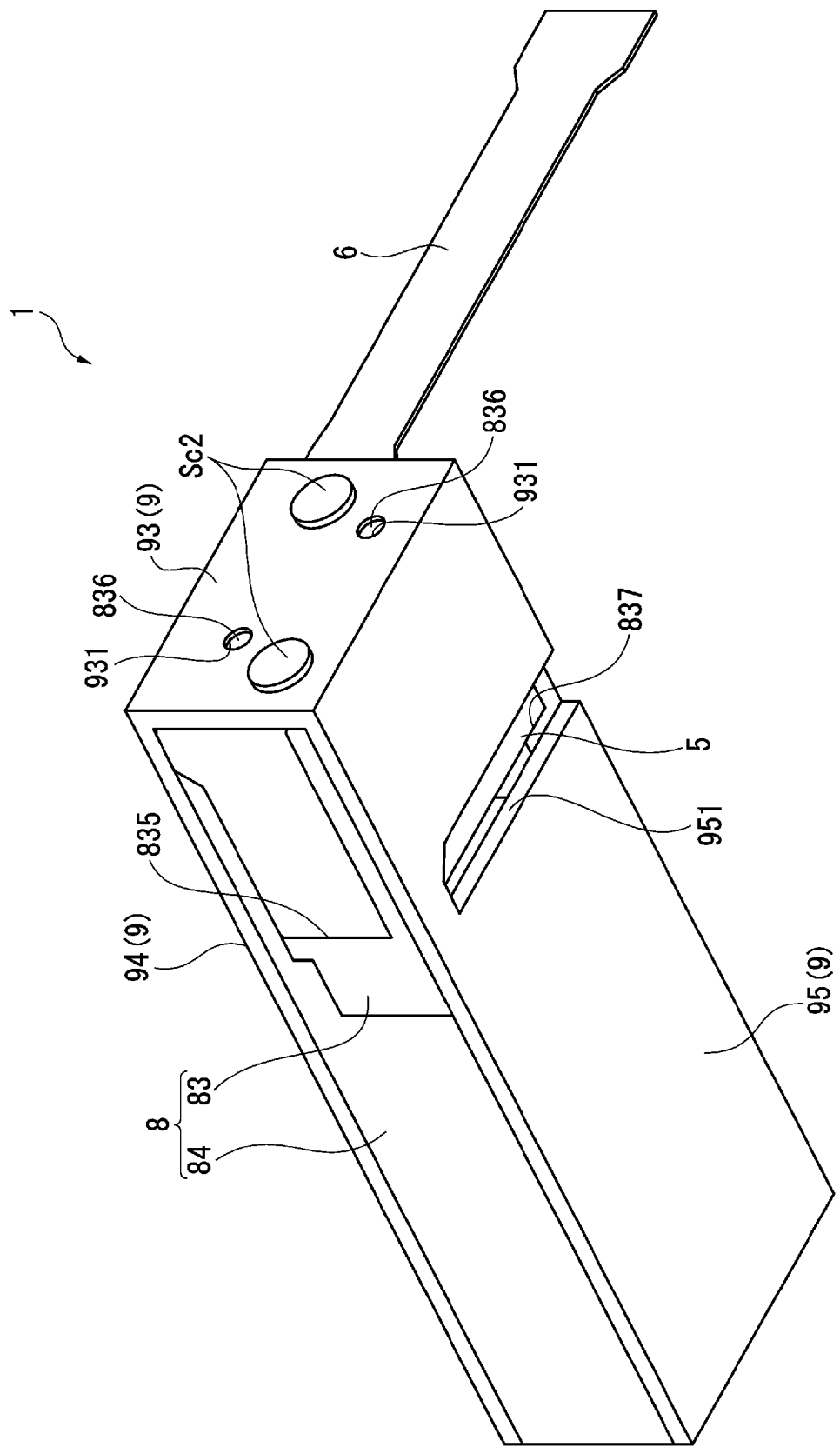
FIG. 7 is a diagram showing the configuration of the projector in the second embodiment.

FIGS. 6 and 7 are diagrams showing the configuration of the projector 1 in the second embodiment. Specifically, FIG. 6 is a perspective view of the projector 1 viewed from the top surface side (the upper side). FIG. 7 is a perspective view of the projector 1 viewed from the bottom surface side (the lower side).

The second embodiment is only different from the first embodiment in that, as shown in FIG. 6 or 7, the light source device 2 is mounted on the FPC 6 (see FIG. 8) and in the configuration of the housing 8 (see FIGS. 9 and 10) and the configuration of the connecting member 9. The other components are the same as those in the first embodiment.

Configuration of the Light Source Device

Figure 8:
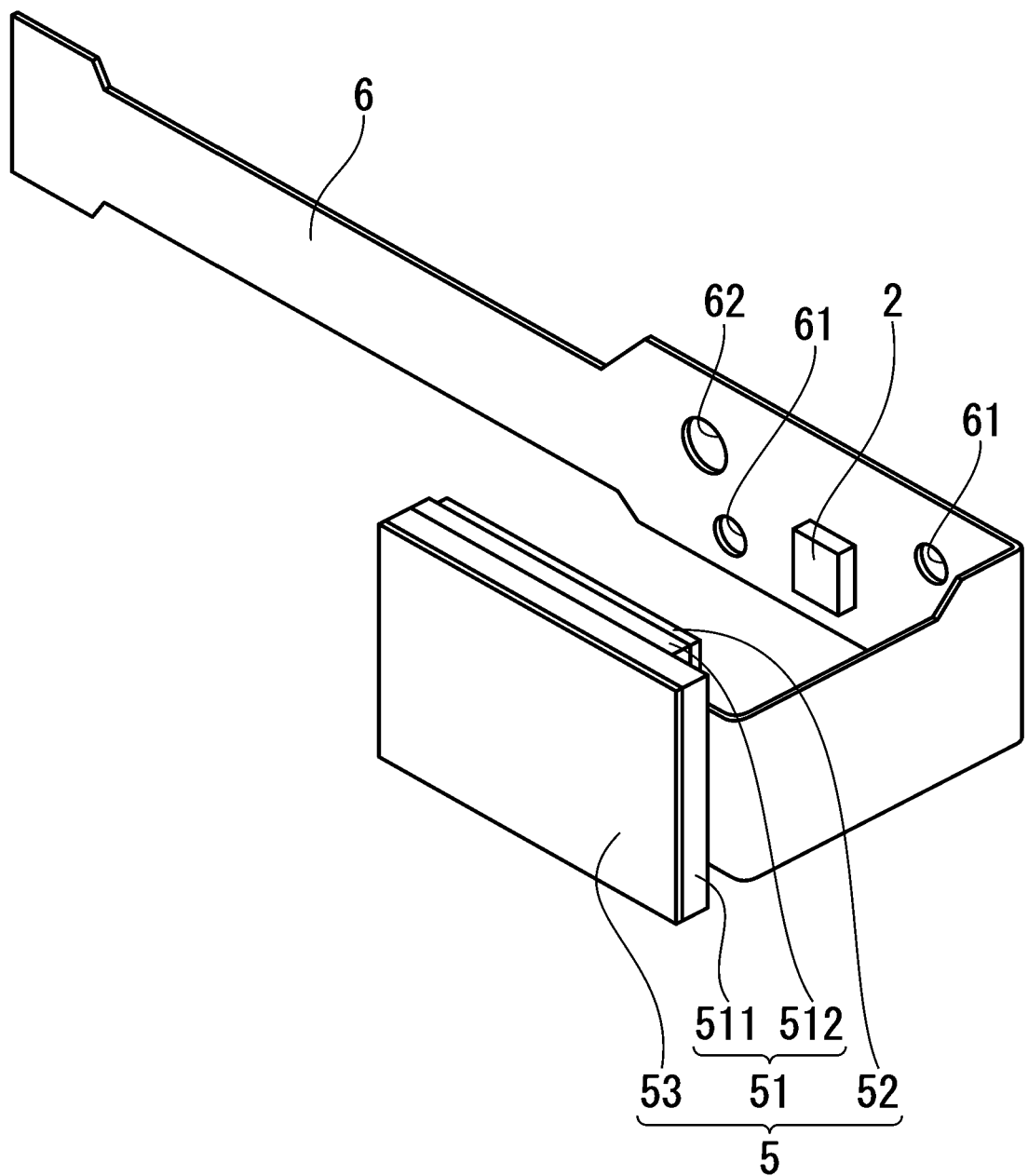
FIG. 8 is a diagram for explaining the configuration of a light source device in the second embodiment.

FIG. 8 is a diagram for explaining the configuration of the light source device 2 in the second embodiment.

The FPC 6 in the second embodiment is formed by patterning signal wires (a signal line for driving of the liquid crystal panel 5, a power supply line for supplying electric power to the light source device 2, and a signal line for lighting control of the light source device 2) and the like on a base material of polyimide or the like. The FPC 6 electrically connects the control board to the liquid crystal panel 5 and the light source device 2.

As shown in FIG. 8, the light source device 2 in the second embodiment includes an LED functioning as a light emitting device and is mounted on the FPC 6.

Electric power for lighting is supplied to the light source device 2 from the control board via the power supply line (not shown in the figure) formed on the FPC 6 and a signal is input to the light source device 2 from the control board via the signal line for lighting control for the light source device 2 formed on the FPC 6, whereby the light source device 2 is subjected to lighting control.

Configuration of the Housing

Figure 9:
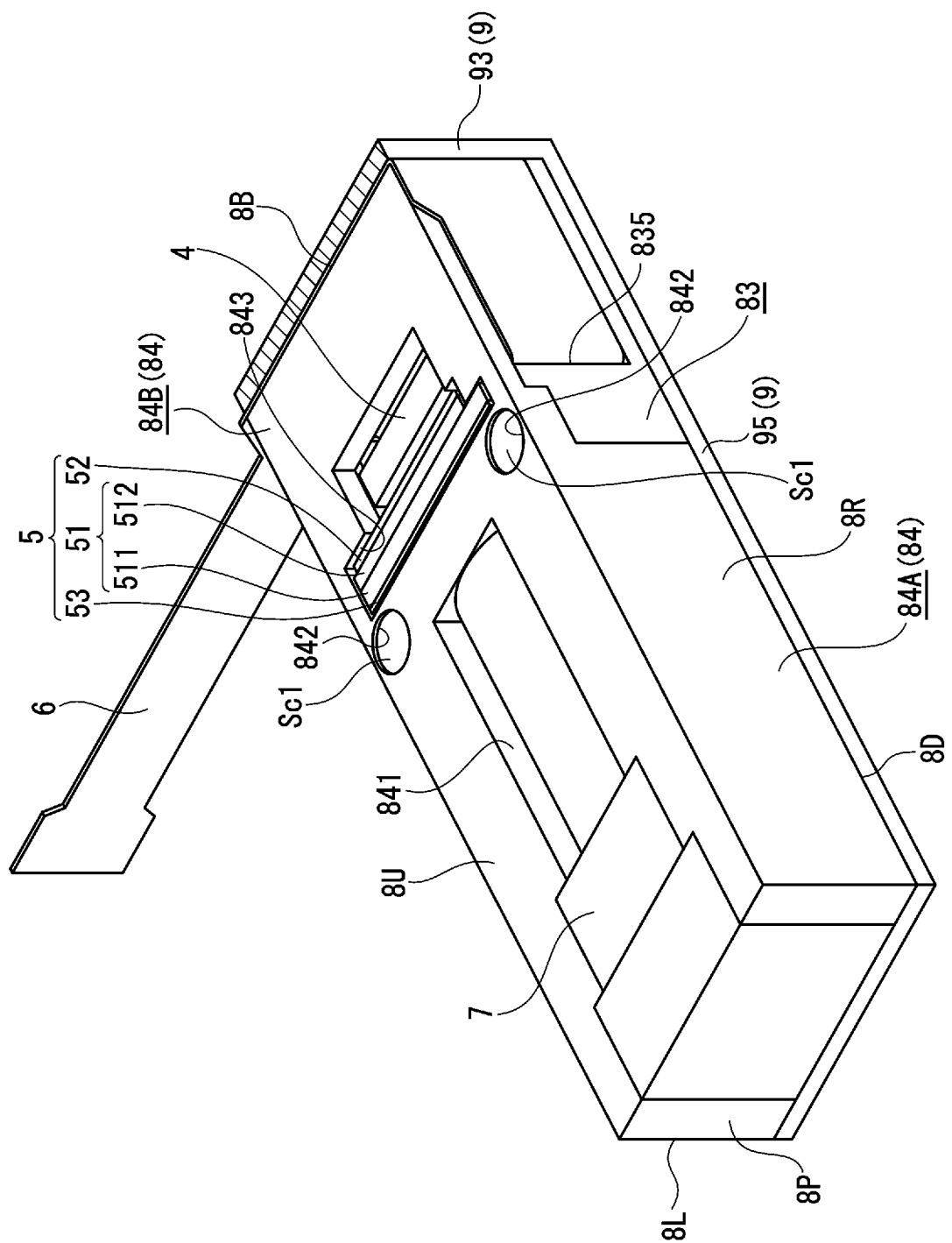
FIG. 9 is a diagram showing the configuration of a housing in the second embodiment.
Figure 10:
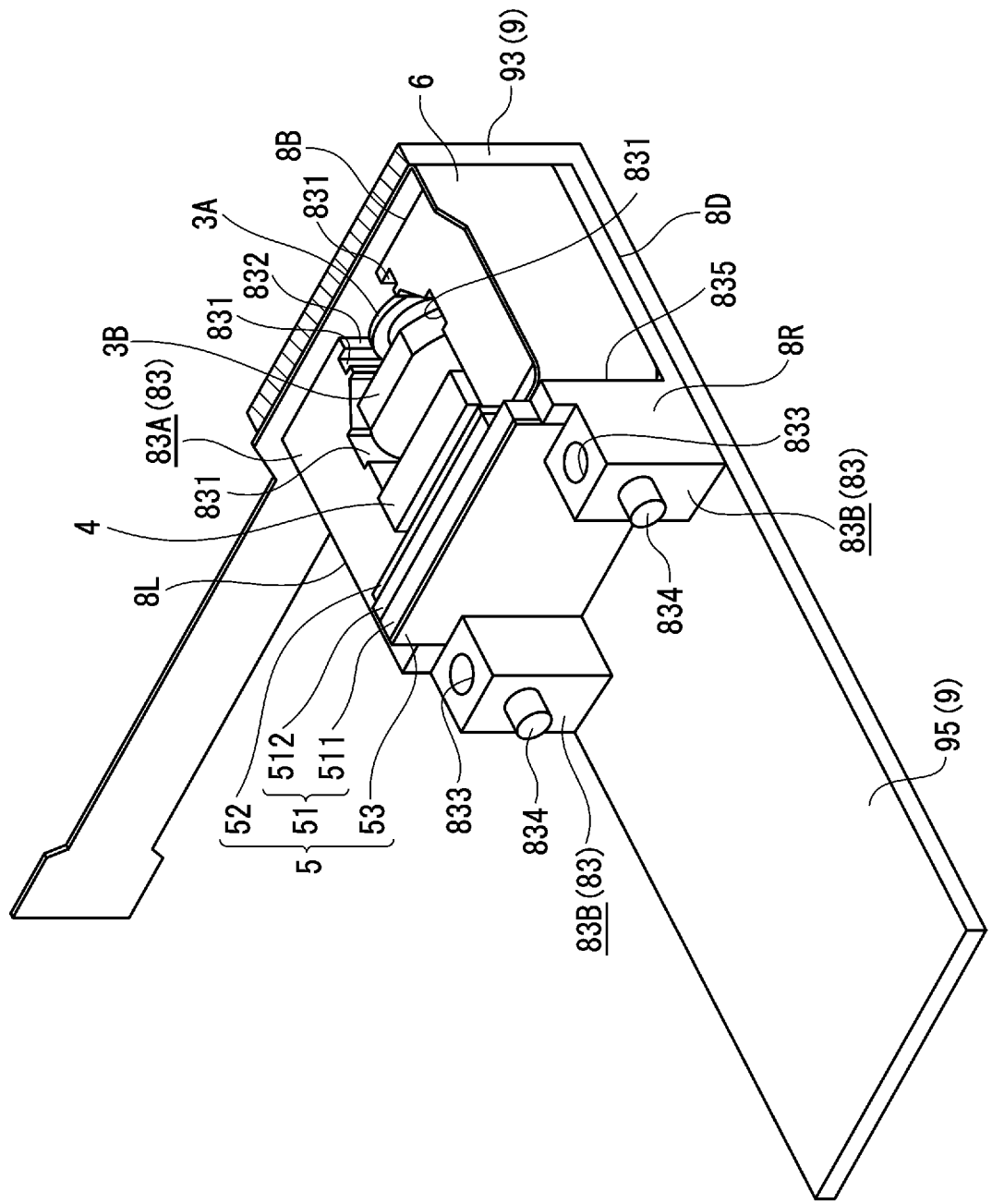
FIG. 10 is a diagram showing the configuration of the housing in the second embodiment.

FIGS. 9 and 10 are diagrams showing the configuration of the housing 8 in the second embodiment. Specifically, FIG. 9 is a perspective view in which a part (a first sidewall section 94) of the connecting member 9 is omitted. FIG. 10 is a perspective view showing a state in which a part (a second housing section 84) of the housing 8 is removed from a state shown in FIG. 9.

As shown in FIG. 9 or 10, the housing 8 in the second embodiment includes first and second housing sections 83 and 84 substantially the same as the housing sections in the first embodiment.

In the following explanation, as in the first embodiment, on the outer surfaces of the housing 8, a surface on the upper side is referred to as first side surface 8U, a surface on the left side viewed from a projection side in FIG. 9 is referred to as second side surface 8L, a surface on the lower side is referred to as third side surface 8D, a surface on the right side viewed from the projection side in FIG. 9 is referred to as fourth side surface 8R, a surface on the projection side is referred to as fifth side surface 8P, and a surface opposed to the fifth side surface 8P is referred to as sixth side surface 8B.

The first housing section 83 is a section in which the light source device 2, the first and second lenses 3A and 3B, the polarizing beam splitter 4, and the liquid crystal panel 5 are housed.

As shown in FIG. 10, the first housing section 83 includes a first body 83A and a pair of first connecting sections 83B.

The first body 83A is formed in a container shape opened on the first side surface 8U side.

In the first body 83A, on the inner surface, as shown in FIG. 10, plural grooves 831 are formed. The plural grooves 831 are used for sliding the first and second lenses 3A and 3B and the polarizing beam splitter 4 from the first side surface 8U side to and displacing the first and second lenses 3A and 3B and the polarization conversion element 4 on the inside of the first body 83A.

In the first body 83A, on the sixth side surface 8B, as shown in FIG. 10, an opening for light source 832 is formed. The opening for light source 832 communicates with the inside and the outside of the first body 83A and is used for disposing the light source device 2 on the inside of the first body 83A.

Further, in the body 83A, on the projection side (the fifth side surface 5P side), although not specifically shown in the figure, an opening for allowing a light beam converted by the polarizing beam splitter 4 is formed.

The pair of first connecting sections 83B are integrally formed at the end on the projection side in the first body 83A and are used in connecting the first and second housing sections 83 and 84.

The pair of first connecting sections 83B are disposed on both the left and right sides viewed from the projection side and have a substantially L shape viewed from the first side surface 8U side.

The pair of first connecting sections 83B support the liquid crystal panel 5 from both the left and right sides and support the liquid crystal panel 5 from light incident and emission sides between the first connecting sections 83B and the first body 83A.

In the pair of first connecting sections 83B, on the first side surface 8U side, as shown in FIG. 10, first screw holes 833 are formed in order to connect the first and second housing sections 83 and 84. In the first screw holes 833, the pair of first fixing screws Sc1 (FIG. 9) are respectively screwed.

In the pair of first connecting sections 83B, on the projection side, as shown in FIG. 10, protrusions 834 used for positioning in connecting the first and second housing sections 83 and 84 are respectively formed.

Further, between the first connecting sections 83B disposed on the fourth side surface 8R side and the first body 83A, as shown in FIG. 10, a first insert-through section 835 having a slit shape for drawing around the FPC 6 to the outside of the housing 8 is formed.

In a state in which the liquid crystal panel 5 is housed in the housing 8, as shown in FIG. 10, the FPC 6 is drawn around to the outside of the housing 8 via the first insert-through section 835.

The FPC 6 is bent about 90 degrees to the sixth side surface 83 side along the fourth side surface 8R of the first housing section 83 and further bent about 90 degrees to the second side surface 8L side along the sixth side surface 8B.

A pair of positioning protrusions 836 (FIG. 7) formed on the sixth side surface 8B of the first housing section 83 are fit in a pair of positioning holes 61 (FIG. 8) formed in the FPC 6, whereby the light source device 2 is positioned in a predetermined position on the inside of the first housing section 83 via the opening for light source 832.

The second housing section 84 is a section in which the projection lens 7 is housed.

As shown in FIG. 9, the second housing section 84 includes a second body 84A and a second connecting section 84B.

The second body 84A has a substantially rectangular parallelepiped shape and has a cutout portion 841 from the fifth side surface 8P to the opposite side (the sixth side surface 8B side) of the projection side. The projection lens 7 is housed on the inside of the cutout section 841.

In the second body 84A, on the opposite side of the projection side, although not specifically shown in the figure, an opening for allowing a light beam modulated by the liquid crystal panel 5 to pass is formed.

As shown in FIG. 9, the second connecting section 84B is integrally formed on the opposite side of the projection side in the second body 84A and is used in connecting the first and second housing sections 83 and 84.

As shown in FIG. 9, the second connecting section 84B is located on the first side surface 8U side and closes an opening portion of the container-like first body 83A in a state in which the first and second housing sections 83 and 84 are combined.

In the second connecting section 84B, in positions corresponding to the pair of first screw holes 833, as shown in FIG. 9, fixing holes 842 are formed in order to connect the first and second housing sections 83 and 84. Through the fixing holes 842, the pair of first fixing screws Sc1 are respectively inserted.

The protrusions 834 of the first housing section 83 are fit in recesses (not shown in the figure) formed in the second body 84A, whereby the second housing section 84 is positioned in a predetermined position with respect to the first housing section 83 and fixed to the first housing section 83 by the pair of first fixing screws Sc1.

In the second connecting section 84B, as shown in FIG. 9, a first opening 843 through which a part (a part on the upper side) of the liquid crystal panel 5 disposed on the inside of the housing 8 is inserted is formed.

In this embodiment, as explained above, the liquid crystal panel 5 is disposed between the first body 83A and the pair of first connecting sections 83B having a substantially L shape. Therefore, in the housing 8, besides the first side surface 8U (the second connecting section 84B), on the third side surface 8D (between the first body 83A and the pair of first connecting sections 83B), a first opening 837 (FIG. 7) through which a part (a part on the lower side) of the liquid crystal panel 5 is inserted is formed.

The first opening 837 is equivalent to the second insert-through section according to the invention.

Configuration of the Connecting Member

The connecting member 9 in the second embodiment is formed of a thermally conductive material such as copper as in the first embodiment.

The connecting member 9 is attached to the outer surface of the housing 8 and radiates the heat of the optical components 2, 3A, 3B, 4, 5, and 7 on the inside of the housing 8, in particular, the light source device 2.

As shown in FIG. 6, 7, 9, or 10, the connecting member 9 includes a light source connecting section 93, a first sidewall section 94, and a second sidewall section 95.

Like the light source connecting section 912 explained in the first embodiment, the light source connecting section 93 includes a plate member having a planar shape substantially the same as the shape of the sixth side surface 8B in the housing 8. The light source connecting section 93 is attached to the sixth side surface 8B, whereby the light source connecting section 93 is connected to the light source device 2 via the opening for light source 832 and the FPC 6 to be capable of transmitting heat.

In the light source connecting section 93, as shown in FIG. 7, a pair of positioning holes 931 in which the pair of positioning protrusions 836 formed in the first housing section 83 are fit are provided.

The pair of positioning protrusions 836 are respectively fit in the pair of positioning holes 931, whereby the connecting member 9 is positioned in a predetermined position with respect to the housing 8 and fixed to the sixth side surface 8B by the pair of second fixing screws Sc2.

In the FPC 6, fixing holes 62 (FIG. 8) through which the pair of second fixing screws Sc2 are inserted are formed. Same fixing holes (not shown in the figure) is formed in the light source connecting section 93. Further, on the sixth side surfaces 8B, a pair of screw holes (not shown in the figure) in which the pair of second fixing screws Sc2 are screwed are formed.

In a state in which the connecting member 9 is fixed to the sixth side surface 8B by the second fixing screws Sc2, the light source connecting section 93 holds the FPC 6 between the light source connecting section 93 and the sixth side surface 8B.

As shown in FIG. 6 or 7, the first and second sidewall sections 94 and 95 include plate members projecting from the upper and lower end edges of the light source connecting section 93, which are opposed to each other, to be substantially orthogonal to each other. The first and second sidewall sections 94 and 95 have a planar shape substantially the same as the shapes of the first and third side surfaces 8U and 8D, respectively.

In a state in which the connecting member 9 is attached to the housing 8, the first and second sidewall sections 94 and 95 are disposed to be opposed to the first and third side surfaces 8U and 8D of the housing 8. In other words, the housing 8 is disposed in a substantially U-shaped space viewed from a side surrounded by the light source connecting section 93 and the first and second sidewall sections 94 and 95.

In the first and second sidewall sections 94 and 95, in positions opposed to the first openings 843 and 837, as shown in FIG. 6 or 7, second openings 941 and 951 cut out to avoid a part of the liquid crystal panel 5 inserted through via the first openings 843 and 837 are respectively formed.

According to the second embodiment, effects explained below are obtained.

In this embodiment, the connecting member 9 attached to the outer surface of the housing 8 includes the light source connecting section 93 connected to the light source device 2 via the opening for light source 832 to be capable of transmitting heat.

Consequently, it is possible to effectively radiate heat generated in the light source device 2 during driving to the outside of the housing 8 via the light source connecting section 93, i.e., effectively cool the light source device 2.

Therefore, it is possible to prevent a temperature rise on the inside of the housing 8 due to the heat generation during driving of the light source device 2 and prevent heat deterioration of not only the light source device 2 but also the other optical components 3A, 3B, 4, 5, and 7.

The connecting member 9 includes the first and second sidewall sections 94 and 95 disposed in positions opposed to each other (upper and lower positions) and connected to the light source connecting section 93.

Consequently, when the projector 1 is incorporated in the electronic device, it is possible to set one of the first and second sidewall sections 94 and 95 in contact with the inner surface of the outer housing in the electronic device. Specifically, since the first and second sidewall sections 94 and 95 are disposed in the positions opposed to each other, even if it is necessary to oppositely set the positional relation between the first and second sidewall sections 94 and 95 because of design, it is possible to set one of the first and second sidewall sections 94 and 95 in contact with the inner surface of the outer housing in the electronic device.

In particular, in this embodiment, the FPC 6 is drawn around such that the other end connected to the control board disposed on the inside of the electronic device is located on the second side surface 8L side in the housing 8. Specifically, since the FPC 6 is drawn around as explained above, the positional relation (an upper and lower positional relation) between the first and second sidewall sections 94 and 95 on the inside of the electronic device is inevitably set according to the position of the control board with respect to the projector 1.

For example, when the control board is positioned on the left side of the projector 1 viewed from the projection side of the projector 1, it is necessary to position the first sidewall section 94 on the upper side and position the second sidewall section 95 on the lower side such that the other end of the FPC 6 is drawn around to the left side (the disposed side of the control board) viewed from the projection side (FIG. 6). When the control board is positioned on the right side of the projector 1 viewed from the projection side of the projector 1, it is necessary to position the second sidewall section 95 on the upper side and the position the first sidewall section 94 on the lower side oppositely to FIG. 6 such that the other end of the FPC 6 is drawn around to the right side viewed from the projection side.

Therefore, even if it is necessary to oppositely set the positional relation between the first and second sidewall sections 94 and 95 (set the projector 1 upside down) according to the position of the control board, it is possible to set one of the first and second sidewall sections 94 and 95 in contact with the inner surface (the top surface or the bottom surface) of the outer housing in the electronic device.

As explained above, one of the first and second sidewall sections 94 and 95 is set in contact with the inner surface of the outer housing in the electronic device. Therefore, it is possible to form a heat transmission path for the outer housing from the light source device 2 to the light source connecting section 93, one of the first and second sidewall sections 94 and 95, and the electronic device. It is possible to effectively radiate the heat of the light source device 2 to the outside of the outer housing in the electronic device through the heat transmission path. Specifically, it is possible to prevent a temperature rise on the inside of the outer housing in the electronic device and prevent heat deterioration of not only the optical components 2, 3A, 3B, 4, 5, and 7 of the projector 1 but also the members included in the electronic device.

The housing 8 is disposed in the space surrounded by the light source connecting section 93 and the first and second sidewall sections 94 and 95. Therefore, it is possible to impart a function of reinforcing the housing 8 to the connecting member 9 besides the heat radiating function.

Further, since the second openings 941 and 951 are respectively formed in the first and second sidewall sections 94 and 95, the part of the liquid crystal panel 5 inserted through the first openings 843 and 837 and the first and second sidewall sections 94 and 95 do not mechanically interfere with each other.

Consequently, it is possible to prevent heat transmitted from the light source device 2 to the light source connecting section 93 and the first and second sidewall sections 94 and 95 from being transmitted to the liquid crystal panel 5 and effectively prevent heat deterioration of the liquid crystal panel 5.

Third Embodiment

A third embodiment is explained with reference to the drawings.

In the following explanation, components and members same as those in the second embodiment are denoted by the same reference numerals and signs and detailed explanation of the components and the members is omitted or simplified.

Figure 11:
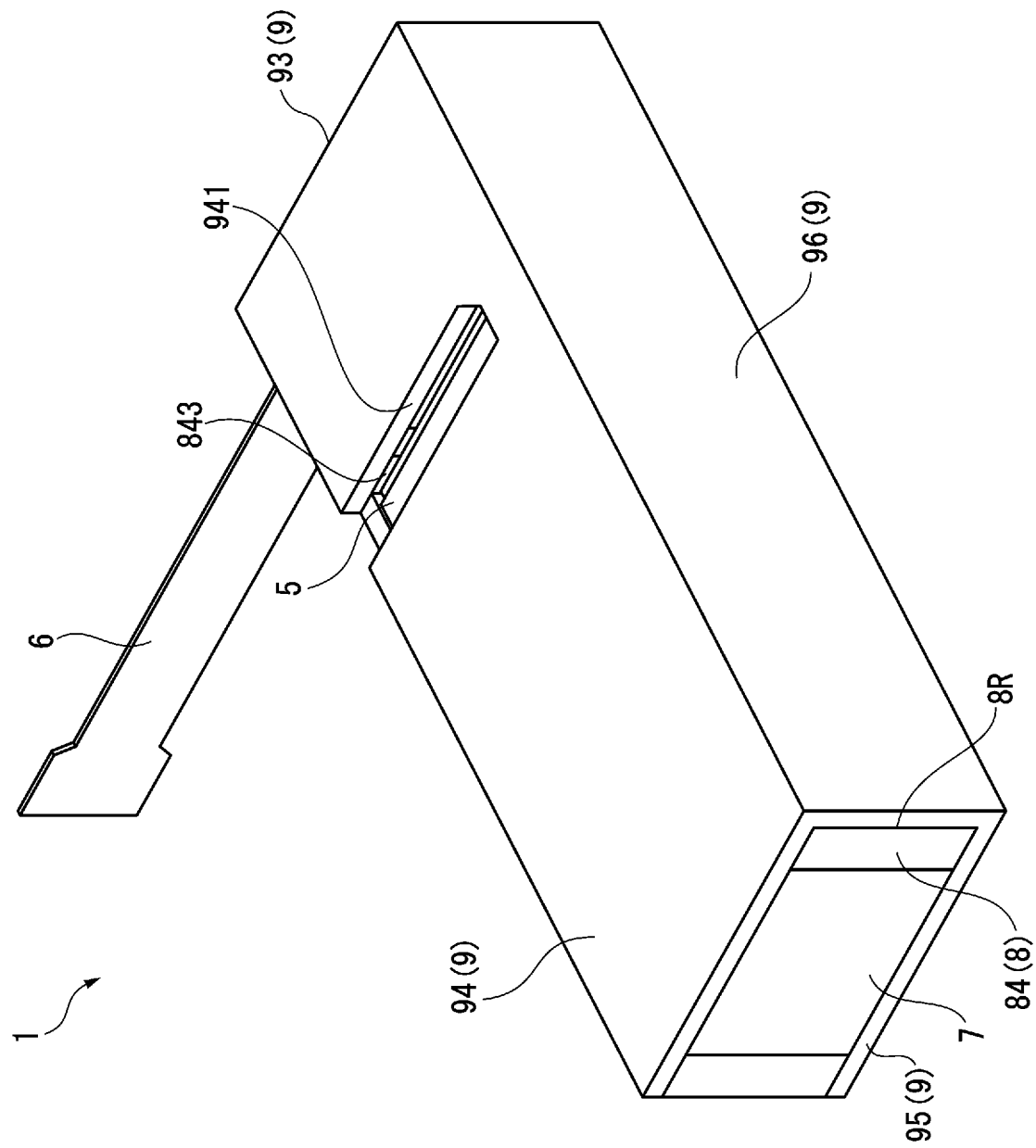
FIG. 11 is a diagram showing the configuration of a projector in a third embodiment.

FIG. 11 is a diagram showing the configuration of the projector 1 in the third embodiment.

In this embodiment, as shown in FIG. 11, the configuration of the connecting member 9 is only different from that in the second embodiment. The other components are the same as those in the second embodiment.

Specifically, as shown in FIG. 11, the connecting member 9 includes a third sidewall section 96 besides the light source connecting section 93 the first and second sidewall sections 94 and 95.

The third sidewall section 96 is connected to the light source connecting section 93 and the first and second sidewall sections 94 and 95 and is disposed to be opposed to the fourth side surface 8R of the housing 8 in a state in which the connecting member 9 is connected to the housing 8.

Specifically, the housing 8 is disposed in a space surrounded by the light source connecting section 93 and the first to third sidewall sections 94 to 96.

Since the third sidewall section 96 is provided in the position explained above, as shown in FIG. 11, the other end of the FPC 6 is drawn around to separate from the third sidewall section 96.

According to the third embodiment, effects explained below are obtained.

In this embodiment, the connecting member 9 includes the third sidewall section 96 besides the light source connecting section 93 and the first and second sidewall sections 94 and 95.

Consequently, if the projector 1 is disposed at a corner portion on the inside of the outer housing in the electronic device, it is possible to set not only one of the first and second sidewall sections 94 and 95 but also the third sidewall section 96 in contact with the inner surface of the outer housing in the electronic device.

Therefore, it is possible to increase a heat quantity transmitted from the connecting member 9 to the outer housing in the electronic device, effectively radiate the heat of the light source device 2 to the outside of the outer housing in the electronic device, and effectively prevent a temperature rise on the inside of the outer housing in the electronic device.

Since the third sidewall section 96 is provided in the connecting member 9 and the housing 8 is disposed in the space surrounded by the light source connecting section 93 and the first to third sidewall sections 94 to 96, it is possible to effectively reinforce the housing 8.

Further, the other end of the FPC 6 is drawn around to separate from the third sidewall section 96. In other words, the third sidewall section 96 is provided on the opposite side of the disposed side of the control board to which the FPC 6 (the other end) is connected.

Consequently, if the projector 1 is disposed at the corner portion on the inside of the outer housing in the electronic device as explained above, it is possible to set the third sidewall section 96 in contact with the inner surface of the outer housing in the electronic device without being limited by the control board (without being obstructed by the control board).

The invention is not limited to the embodiments explained above. Modifications, improvements, and the like within a range in which the object of the invention can be attained are included in the invention.

In the embodiments, the liquid crystal panel 5 includes a transmissive liquid crystal panel. However, the liquid crystal panel 5 is not limited to this and may include a reflective liquid crystal panel.

In the liquid crystal panel 5, color filters may be provided as appropriate to display three colors of red (R), green (G), and blue (B) for each of pixels and form a color image.

In the first embodiment, the housing 8 includes the two members of the first and second housing sections 81 and 82 formed separate from each other. However, the housing 8 is not limited to this and may include one member. In the second and third embodiments, similarly, the housing 8 may include one member.

In the embodiments, the light source device 2 includes the LED. However, the light source device 2 is not limited to this and may adopt another light emitting device such as a laser diode, an organic EL (Electro Luminescence) device, or a silicon light emitting device.

In the second and third embodiments, the light source device 2 includes the LED mounted on the FPC 6. However, the light source device 2 is not limited to this and, as in the first embodiment, may include a printed circuit board different from the FPC 6 and an LED mounted on the printed circuit board. The light source connecting section 93 may be connected to the printed circuit board to be capable of transmitting heat.

In order to effectively transmit the heat of the LED to the light source connecting section 93, it is preferable that the printed circuit board includes a metal core PCB (Printed Circuit Board) processed using metal such as aluminum or copper as a base.

The invention can be used in a projector including a light source device, a light modulating device that modulates a light beam emitted from the light source device, and a projection optical device that projects the light beam modulated by the light modulating device.

The entire disclosure of Japanese Patent Application No.: 2011-137999, filed Jun. 22, 2011 and 2011-138237, filed Jun. 22, 2011 are expressly incorporated by reference herein.

The invention claimed is:

1. A projector including a light source device, a light modulating device that modulates a light beam emitted from the light source device, and a projection optical device that projects the light beam modulated by the light modulating device, the projector comprising:
 a flexible printed circuit board, one end of which is connected to the light modulating device; and
 a housing in which the light source device, the light modulating device, and the projection optical device are housed, wherein
 in a position in the housing where the light modulating device is disposed, a first insert-through section for drawing around the flexible printed circuit board to an outside of the housing and a second insert-through section, through which a part of the light modulating device is inserted, are formed,
 the housing including a first housing section and a second housing section formed separate from each other and combined with each other, and
 the light modulating device being disposed in a connecting position of the first housing section and the second housing section.

2. The projector according to claim 1, wherein
 a first insert-through section for drawing around the flexible printed circuit board to an outside of the housing and a second insert-through section ,through which a part of the light modulating device is inserted ,are formed in a position in the housing where the light modulating device is disposed, and
 the first insert-through section and the second insert-through section are formed by combining the first housing section and the second housing section.

3. The projector according to claim 2, further comprising a connecting member that integrates the first housing section and the second housing section.

4. The projector according to claim 3, wherein
 the housing is formed to have a substantially rectangular parallelepiped shape by combining the first housing section and the second housing section, and
 the connecting member includes:
 a connecting member body attached to a first side surface of the housing to extend over the connecting position; and
 a reinforcing section that projects from the connecting member body and is disposed to be opposed to a second side surface different from the first side surface in the housing to extend over the connecting position.

5. The projector according to claim 4, wherein the first insert-through section is formed on the second side surface.

6. The projector according to claim 3, wherein
 the housing is formed to have a substantially rectangular parallelepiped shape by combining the first housing section and the second housing section, the connecting member includes a connecting member body attached to a first side surface of the housing to extend over the connecting position, a first opening for inserting the light modulating device into an inside of the housing is formed on the first side surface, a part of the light modulating device projects from the first opening in a state in which the light modulating device is housed in the housing, and a second opening through which the part of the light modulating device projecting from the first opening is inserted is formed in the connecting member body.

7. The projector according to claim 3, wherein the connecting member is formed of a thermally conductive material and includes a light source connecting section connected to the light source device to be capable of transmitting heat.

8. The projector according to claim 1, further comprising a connecting member formed of a thermally conductive material and attached to an outer surface of the housing, wherein an opening for light source is formed in the housing to correspond to a disposed position of the light source device, the connecting member includes:

a light source connecting section connected to the light source device via the opening for light source to be capable of transmitting heat; and a first sidewall section and a second sidewall section respectively projecting from end edges opposed to each other in the light source connecting section, and the housing is disposed in a space surrounded by the light source connecting section, the first sidewall section, and the second sidewall section.

9. The projector according to claim 8, wherein a first opening through which a part of the light modulating device is inserted is formed in the housing, and a second opening cut out to avoid the part of the light modulating device inserted through the first opening is formed in the first sidewall section.

10. The projector according to claim 8, wherein the connecting member includes a third sidewall section connected to the light source connecting section, the first sidewall section, and the second sidewall section, and the housing is disposed in a space surrounded by the light source connecting section, the first sidewall section, the second sidewall section, and the third sidewall section.

11. The projector according to claim 10, wherein the flexible printed circuit board is drawn around such that the other end separates from the third sidewall section via the first insert-through section.

* * * * *